(12) United States Patent
Nakiboglu et al.

(10) Patent No.: US 11,579,533 B2
(45) Date of Patent: *Feb. 14, 2023

(54) SUBSTRATE HOLDER, A LITHOGRAPHIC APPARATUS AND METHOD OF MANUFACTURING DEVICES

(71) Applicant: ASML NETHERLANDS B.V., Veldhoven (NL)

(72) Inventors: Günes Nakiboglu, Eindhoven (NL); Coen Hubertus Matheus Baltis, Eindhoven (NL); Siegfried Alexander Tromp, Knegsel (NL); Yuri Johannes Gabriël Van De Vijver, Best (NL); Bert Dirk Scholten, Best (NL); Daan Daniel Johannes Antonius Van Sommeren, Beuningen (NL); Mark Johannes Hermanus Frencken, Ittervoort (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/151,291

(22) Filed: Jan. 18, 2021

(65) Prior Publication Data
US 2021/0141312 A1 May 13, 2021

Related U.S. Application Data

(63) Continuation of application No. 15/779,804, filed as application No. PCT/EP2016/076357 on Nov. 2, 2016, now Pat. No. 10,895,808.

(30) Foreign Application Priority Data

Dec. 15, 2015 (EP) .................................. 15200143

(51) Int. Cl.
G03F 7/20 (2006.01)
H01L 21/027 (2006.01)
H01L 21/687 (2006.01)

(52) U.S. Cl.
CPC ...... *G03F 7/70341* (2013.01); *G03F 7/70716* (2013.01); *G03F 7/70733* (2013.01);
(Continued)

(58) Field of Classification Search
CPC ............. G03F 7/70341; G03F 7/70716; G03F 7/70733; G03F 7/70858; G03F 7/707;
(Continued)

(56) References Cited

U.S. PATENT DOCUMENTS 7,307,696 B2 12/2007 Ottens
7,397,532 B2 7/2008 Novak
(Continued)

FOREIGN PATENT DOCUMENTS

CN 1572014 1/2005
CN 101868863 10/2010
(Continued)

OTHER PUBLICATIONS

Notice of Allowance dated Jan. 9, 2019, issued in corresponding U.S. Appl. No. 15/781,813.
(Continued)

*Primary Examiner* — Hung V Nguyen
(74) *Attorney, Agent, or Firm* — Pillsbury Winthrop Shaw Pittman, LLP

(57) ABSTRACT

A substrate holder for use in a lithographic apparatus and configured to support a substrate, the substrate holder including a main body having a main body surface; a plurality of burls projecting from the main body surface to support the substrate spaced apart from the main body surface; and a liquid control structure provided in a periph-
(Continued)

eral region of the main body surface and configured to cause liquid to preferentially flow toward the periphery of the main body surface.

20 Claims, 11 Drawing Sheets

(52) U.S. Cl.
CPC ...... *H01L 21/0274* (2013.01); *H01L 21/6875* (2013.01); *G03F 7/70858* (2013.01)

(58) Field of Classification Search
CPC ............. H01L 21/0274; H01L 21/6875; H01L 21/68735
See application file for complete search history.

(56) References Cited

U.S. PATENT DOCUMENTS

| | | | |
|---|---|---|---|
| 7,862,657 | B2 | 1/2011 | Onomura et al. |
| 9,785,055 | B2 | 10/2017 | Laurent et al. |
| 9,915,877 | B2 | 3/2018 | Laurent et al. |
| 10,895,808 | B2 * | 1/2021 | Nakiboglu .......... G03F 7/70733 |
| 2004/0109981 | A1 | 6/2004 | Lawrence et al. |
| 2004/0160582 | A1 | 8/2004 | Lof et al. |
| 2004/0207824 | A1 | 10/2004 | Lof et al. |
| 2005/0264778 | A1 | 12/2005 | Lof et al. |
| 2007/0109521 | A1 | 5/2007 | Nishii et al. |
| 2007/0146665 | A1 | 6/2007 | Ottens et al. |
| 2007/0146666 | A1 | 7/2007 | Leenders et al. |
| 2007/0229786 | A1 | 10/2007 | Kemper et al. |
| 2007/0242242 | A1 | 10/2007 | Nagasaka |
| 2008/0198346 | A1 | 8/2008 | Iimura et al. |
| 2009/0059191 | A1 | 3/2009 | Ogusu |
| 2009/0168042 | A1 | 7/2009 | Kroonen et al. |
| 2009/0218743 | A1 | 9/2009 | Fujiwara et al. |
| 2009/0279058 | A1 | 11/2009 | Hasegawa |
| 2009/0296056 | A1 | 12/2009 | Mondt et al. |
| 2009/0296065 | A1 | 12/2009 | Cloin |
| 2010/0045949 | A1 | 2/2010 | Nakano et al. |
| 2010/0118289 | A1 | 5/2010 | Ogusu |
| 2011/0228238 | A1 | 9/2011 | Roset et al. |
| 2013/0033692 | A1 | 2/2013 | Bessems et al. |
| 2013/0057838 | A1 | 3/2013 | Sato |
| 2015/0131064 | A1 | 5/2015 | Laurent et al. |
| 2017/0315454 | A1 | 11/2017 | Laurent et al. |
| 2018/0267412 | A1 | 9/2018 | Laurent et al. |

FOREIGN PATENT DOCUMENTS

| | | |
|---|---|---|
| CN | 104541206 | 4/2015 |
| EP | 1420298 | 5/2004 |
| EP | 1420299 | 5/2004 |
| EP | 2738792 | 6/2014 |
| JP | 2004-289127 | 10/2004 |
| JP | 2005-303167 | 10/2005 |
| JP | 2006-054427 | 2/2006 |
| JP | 2007-180555 | 7/2007 |
| JP | 2007-194613 | 8/2007 |
| JP | 2010-206113 | 9/2010 |
| JP | 2007-180555 | 7/2012 |
| JP | 2014-060217 | 4/2014 |
| WO | 2004/112108 | 12/2004 |
| WO | 2013/178484 | 12/2013 |
| WO | 2017/097502 | 6/2017 |

OTHER PUBLICATIONS

Japanese Office Action issued in corresponding Japanese Patent Application No. 2018-517720 dated Jun. 6, 2019.
Notice of Allowance dated Oct. 28, 2019 issued in corresponding U.S. Appl. No. 16/407,878.
International Search Report issued in corresponding International Patent Application No. PCT/EP2016/076357 dated Mar. 10, 2017.
Written Opinion of the International Searching Authority issued in corresponding International Patent Application No. PCT/EP2016/076357 dated Mar. 10, 2017.
Jiansheng Feng et al., "One-way wicking in open micro-channels controlled by channel topography", Journal of Colloid and Interface Science, vol. 404 (2013) pp. 169-178.

* cited by examiner

SUBSTRATE HOLDER, A LITHOGRAPHIC APPARATUS AND METHOD OF MANUFACTURING DEVICES

This application is a continuation of U.S. patent application Ser. No. 15/779,804, filed May 29, 2018, which is the U.S. national phase entry of PCT patent application no. PCT/EP2016/076357, which was filed on Nov. 2, 2016, which claims the benefit of priority of European patent application no. 15200143.4, which was filed on Dec. 15, 2015, each of the foregoing applications is incorporated herein in its entirety by reference.

FIELD

The present description relates to a substrate holder, a lithographic apparatus using the substrate holder, and a method of making devices using the substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final optical element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a lithographic apparatus a substrate holder having a plurality of burls to support the substrate is commonly used. The substrate is conventionally clamped to the substrate holder during exposures. In an immersion lithography apparatus, liquid can get into the space between the substrate and the substrate holder during exposures. The presence of such liquid can make it more difficult to unload the substrate from the substrate holder after it has been exposed.

It is desirable, for example, to provide an improved substrate holder that can avoid difficulties experienced in the prior art in unloading a substrate from the substrate holder if liquid has entered the space between the substrate and substrate holder.

According to an aspect, there is provided a substrate holder for use in a lithographic apparatus and configured to support a substrate, the substrate holder comprising:
    a main body having a main body surface;
    a plurality of burls projecting from the main body surface to support the substrate spaced apart from the main body surface; and
    a liquid control structure provided in a peripheral region of the main body surface and configured to cause liquid to preferentially flow toward the periphery of the main body surface.

According to an aspect, there is provided a substrate holder for use in a lithographic apparatus and configured to support a substrate, the substrate holder comprising:
    a main body having a main body surface;
    a plurality of burls projecting from the main body surface to support the substrate spaced apart from the main body surface; and
    a liquid control structure provided in a peripheral region of the main body surface and configured to hinder movement of liquid across the peripheral region toward the center of the main body surface, but not to hinder movement of gas across the peripheral region.

According to an aspect, there is provided a method of manufacturing devices using a lithographic apparatus having a substrate holder as described above and a clamp system for clamping a substrate to the substrate holder, the method comprising:
    loading the substrate onto the substrate holder;
    engaging the clamp system;
    exposing a pattern onto the substrate;
    releasing the clamp system; and
    lifting the substrate off the substrate holder.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
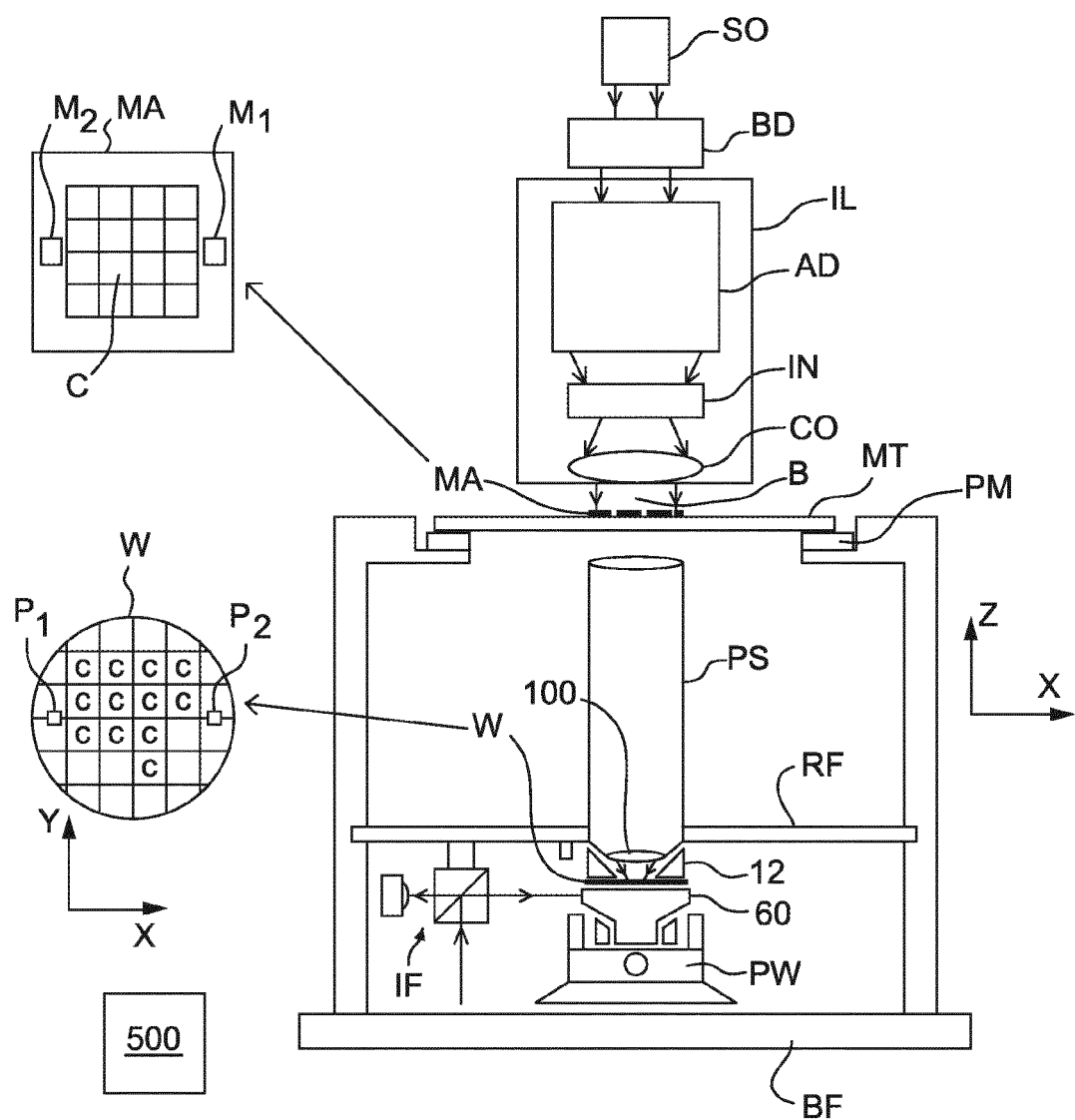
FIG. 1 schematically depicts a lithographic apparatus.

FIG. 1 schematically depicts a lithographic apparatus of an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables configured to measure properties of the projection system PS and not configured to hold a substrate W. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are commanded out.

The lithographic apparatus is of a type wherein at least a portion of the substrate W may be covered by an immersion liquid 10 having a relatively high refractive index, e.g. water such as ultra pure water (UPW), so as to fill an immersion space 11 between the projection system PS and the substrate W. An immersion liquid 10 may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in immersion liquid 10; rather "immersion" only means that an immersion liquid 10 is located between the projection system PS and the substrate W during exposure. The path of the patterned radiation beam B from the projection system PS to the substrate W is entirely through immersion liquid 10.

Referring to FIG. 1, the illuminator IL receives a radiation beam B from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing immersion liquid between a final optical element of the projection system PS and the substrate W can be classed into three general categories.

These are the bath type arrangement, the so-called localized immersion systems and the all-wet immersion systems. An embodiment relates particularly to the localized immersion systems.

Figure 2:
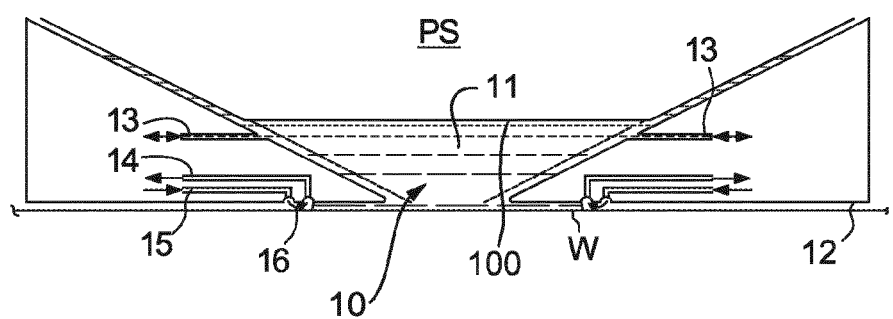
FIG. 2 schematically depicts an immersion liquid confinement structure for use in a lithographic projection apparatus.

In an arrangement which has been proposed for a localized immersion system a liquid confinement structure 12 extends along at least a part of a boundary of an immersion space 11 between the final optical element 100 of the projection system PS and the facing surface of the stage or table (referred to herein as the substrate support apparatus 60) facing the projection system PS. The facing surface of the table is referred to as such because the table is moved during use and is rarely stationary. Generally, the facing surface of the table is a surface of a substrate W, substrate table WT which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 11 between the final optical element 100 of the projection system PS and the substrate table WT or substrate W. In an embodiment, a seal is formed between the liquid confinement structure 12 and the surface of the substrate W/substrate support apparatus 60. The seal may be a contactless seal such as a gas seal 16 (such a system with a gas seal is disclosed in European patent application publication no. EP-A-1,420,298) or an immersion liquid seal.

The liquid confinement structure 12 is configured to supply and confine immersion liquid 10 to the immersion space 11. Immersion liquid 10 is brought into the immersion space 11 through one of liquid openings 13. The immersion liquid 10 may be removed through another of liquid openings 13. The immersion liquid 10 may be brought into the immersion space 11 through at least two liquid openings 13. Which of liquid openings 13 is used to supply immersion liquid 10 and optionally which is used to remove immersion liquid 10 may depend on the direction of motion of the substrate support apparatus 60.

Immersion liquid 10 may be contained in the immersion space 11 by the gas seal 16 which, during use, is formed between the bottom of the liquid confinement structure 12 and the facing surface of the table (i.e. the surface of the substrate W and/or the surface of the substrate support apparatus 60). The gas in the gas seal 16 is provided under pressure via gas inlet 15 to a gap between the liquid confinement structure 12 and substrate W and/or substrate support apparatus 60. The gas is extracted via a channel associated with gas outlet 14. The overpressure on the gas 15, vacuum level on the gas outlet 14 and geometry of the gap are arranged so that there is a high-velocity gas flow inwardly that confines the immersion liquid 10. The force of the gas on the immersion liquid 10 between the liquid confinement structure 12 and the substrate W and/or substrate support apparatus 60 contains the immersion liquid 10 in the immersion space 11. A meniscus forms at a boundary of the immersion liquid 10. Such a system is disclosed in United States patent application publication no. US 2004-0207824. Other immersion liquid confinement structures 12 can be used with embodiments.

Figure 3:
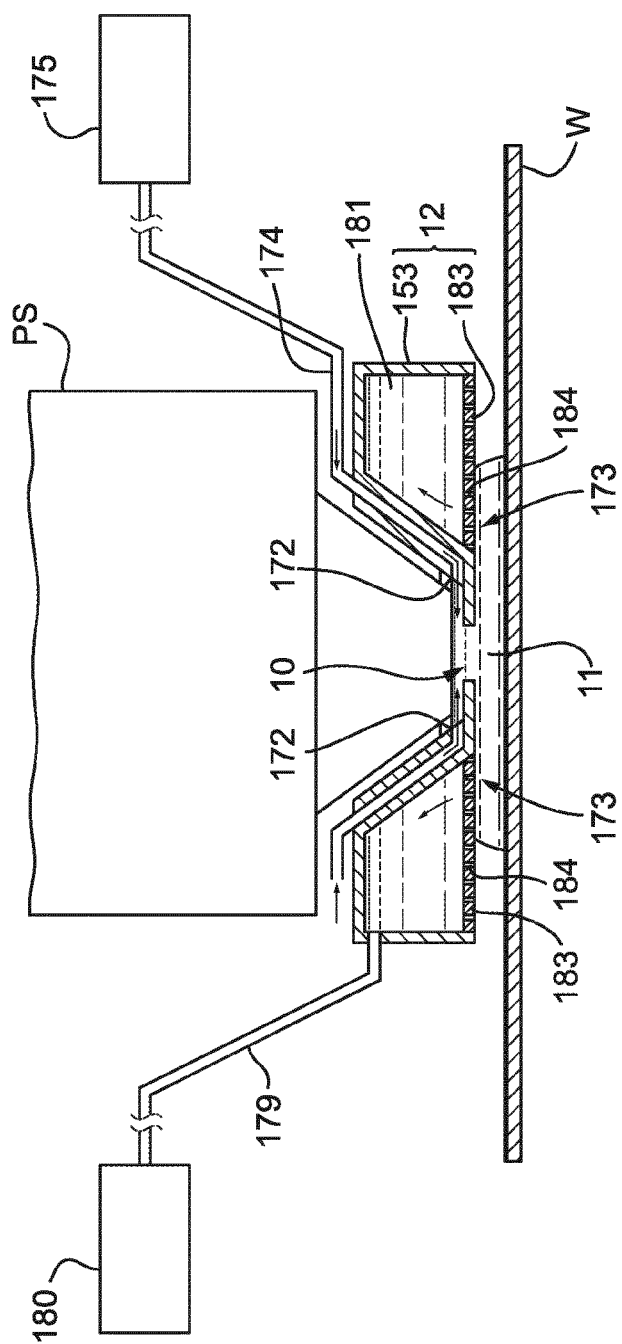
FIG. 3 is a side cross sectional view that schematically depicts a further immersion liquid supply system.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the space between the final optical element of the projection system PS and the substrate support apparatus 60 and/or substrate W. (Reference in the following text to surface of the substrate W also refers in addition or in the alternative to a surface of the substrate support apparatus 60, unless expressly stated otherwise.)

The liquid confinement structure 12 at least partly contains immersion liquid 10 in the immersion space 11 between the final optical element of the projection system PS and the substrate W and/or substrate support apparatus 60. The immersion space 11 is at least partly formed by the liquid confinement structure 12 positioned below and surrounding the final optical element of the projection system PS. The liquid confinement structure 12 can comprise a main body member 153 and a porous member 183. The porous member 183 is plate shaped and has a plurality of holes 184 (i.e. openings or pores). The porous member 183 can be a mesh plate wherein numerous small holes 184 are formed in a mesh. Such a system is disclosed in United States patent application publication no. US 2010/0045949 A1.

The main body member 153 comprises one or more supply ports 172, which are capable of supplying the immersion liquid 10 to the immersion space 11, and a recovery port 173, which is capable of recovering the immersion liquid 10 from the immersion space 11. The one or more supply ports 172 are connected to a liquid supply apparatus 175 via a passageway 174. The liquid supply apparatus 175 is capable of supplying the immersion liquid 10 to the one or more supply ports 172. The immersion liquid 10 that is fed from the liquid supply apparatus 175 is supplied to the one or more supply ports 172 through the corresponding passageway 174. The one or more supply ports 172 are disposed in the vicinity of the optical path at a respective prescribed position of the main body member 153 that faces the optical path. The recovery port 173 is capable of recovering the immersion liquid 10 from the immersion space 11. The recovery port 173 is connected to a liquid recovery apparatus 180 via a passageway 179. The liquid recovery apparatus 180 comprises a vacuum system and is capable of recovering the immersion liquid 10 by sucking it via the recovery port 173. The liquid recovery apparatus 180 recovers the immersion liquid 10 recovered via the recovery port 173 through the passageway 179. The porous member 183 is disposed in the recovery port 173.

To form the immersion space 11 with the immersion liquid 10 between the projection system PS and the liquid confinement structure 12 on one side and the substrate W on the other side, immersion liquid 10 is supplied from the one or more supply ports 172 to the immersion space 11 and the pressure in a recovery chamber 181 in the liquid confinement structure 12 is adjusted to a negative pressure so as to recover the immersion liquid 10 via the holes 184 (i.e. the recovery port 173) of the porous member 183. Performing the liquid supply operation using the one or more supply ports 172 and the liquid recovery operation using the porous member 183 forms the immersion space 11 between the projection system PS and the liquid confinement structure 12 and the substrate W.

Figure 4:
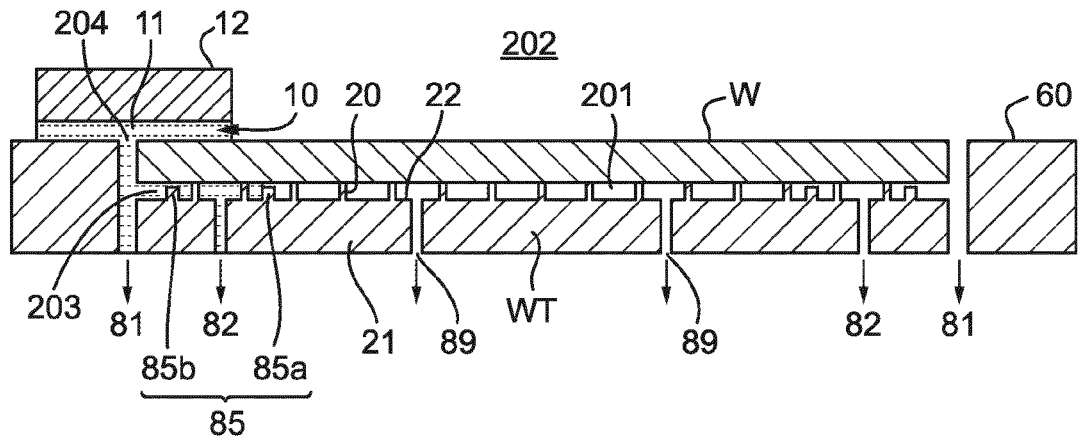
FIG. 4 depicts in cross-section a substrate holder and substrate in a conventional lithographic apparatus of the localized immersion type.

As shown in FIG. 4, a substrate W is supported on burls 20 of substrate holder WT in a recess in substrate support apparatus 60 so that the upper surface of substrate W is substantially coplanar with the surrounding upper surface of substrate support apparatus 60. The substrate W is clamped to the substrate holder WT by connecting clamp openings 89 to a clamp under-pressure so that the central space 201 between the substrate W and substrate holder WT is at a lower pressure than the space 202 above substrate W. Hence atmospheric pressure above the substrate W holds it firmly onto substrate holder WT. Edge seals 85a, 85b project upwardly from the substrate holder WT to minimize the gap between the substrate holder WT and substrate W to minimize the flow of air from the surroundings into the space underneath substrate W and hence reduce the load on the clamp under-pressure. Burls 20 can be provided in the region between edge seal ridges 85a, 85b; in FIG. 4 two rows of burls 20 are provided but it is possible to have more, fewer or no rows.

A gap 204 exists between the outer edge of substrate W and substrate support apparatus 60, though is made as small as possible. At various times in exposure of a substrate W, the substrate support apparatus 60 moves under the liquid confinement system 12 so that the immersion space 11 will overlap the edge of the substrate W. When it does so, immersion liquid 10 will enter the gap 204 between the edge of the substrate W and the upper surface of the substrate support apparatus 60, as shown in FIG. 4. A first extraction opening 81, which may be two phase, is provided and connected to a first extraction under-pressure to remove liquid which enters the gap 204. However, it is possible that liquid will enter the peripheral space 203 between the substrate holder WT and substrate W at the periphery thereof. A second extraction opening 82, which may be two phase, is connected to a second extraction under-pressure to remove liquid that has entered the space between the substrate W and substrate holder WT.

In spite of the extraction of liquid through first and second extraction openings 81, 82, after a series of exposures it is possible that liquid will still remain between the substrate W and substrate holder WT, in particular in the peripheral space 203 outside the edge seal 85. Any liquid remaining in the peripheral space 203 hinders unloading of the substrate W. Therefore a delay is introduced before the substrate W can be lifted off the substrate holder WT, e.g. by e-pins (not shown), or a greater force needs to be exerted to lift the substrate W. Delay in releasing the under-pressure in the central space 201 reduces throughput of the apparatus. Also, attractive forces between the liquid in the peripheral space 203, the substrate W and the substrate holder WT tend to hold down the edges of the substrate W as it is lifted. A tendency for the edges of the substrate W to be held down as the substrate W is lifted causes wear of the burls of the substrate holder WT.

Accordingly, an embodiment provides a substrate holder for use in a lithographic apparatus and configured to support a substrate, the substrate holder comprising:

a main body having a main body surface;

a plurality of burls projecting from the main body surface to support the substrate spaced apart from the main body; and a liquid control structure provided in a peripheral region of the main body surface and configured to cause liquid to preferentially flow toward the periphery of the main body surface.

The liquid control structure ensures that liquid that has entered into the space between the substrate and the substrate holder tends to flow back out from that space so that it does not hinder unloading of the substrate. Liquid only enters the space between the substrate W and substrate holder WT intermittently during a series of exposures, therefore the liquid control structure does not need to completely prevent liquid from entering the space between the substrate and the substrate holder but rather only needs to promote outward flow of the liquid sufficiently to ensure that the amount of liquid present when the substrate is unloaded is reduced. Desirably, the liquid control structure ensures that the rate of flow outward from the space between the substrate and the substrate holder is greater than the flow inward to the space between the substrate and the substrate holder, averaged over the time taken for exposure of a whole substrate.

In an embodiment, the liquid control structure comprises a plurality of channels extending from an inner side of the peripheral region to an outer side of the peripheral region. The channels encourage liquid flow toward the outer side of the peripheral region.

In an embodiment, the liquid control structure further comprises a plurality of fins projecting from side walls of the channels and angled towards the inner side of the peripheral region. The fins act to control flow of liquid in the channels by ensuring that the liquid can easily flow toward the outer side of the peripheral region but flows less easily towards the inner side of the peripheral region. In effect the fins act as a microfluidic diode. In an embodiment, flow of liquid towards the center of the substrate holder is completely stopped.

In an embodiment, the channels reduce in width towards the outer side of the peripheral region. The reduction in width, in other words the taper, of the channels functions to create capillary forces that draw liquid towards the outer side of the peripheral region.

In an embodiment, the channels increase in depth towards the outer side of the peripheral region. The increasing depth of the channels towards the outer side of the peripheral region encourages flow of liquid toward the outer side of the peripheral region. In an embodiment, the channels have a depth greater than or equal to 50 µm, desirably greater than or equal to 100 µm. This depth allows a sufficient flow of liquid and can easily be manufactured.

In an embodiment, the liquid control structure creates capillary forces to cause liquid to preferentially flow toward the periphery of the main body surface. In an embodiment, the channels have a width greater than or equal to 50 µm, desirably in the range of 60 µm to 200 µm. A width of these dimensions is effective to provide capillary forces. In an embodiment, the liquid control structure has a Reynolds number less than 5, desirably less than 1, desirably about 0.5. A Reynolds number in these ranges is effective to provide capillary forces. The liquid control structure can be described as a microfluidic structure.

In an embodiment, the liquid control structure further comprises a groove extending along the inner side of the peripheral region. The groove extending along the inner side of the peripheral region allows liquid, which may be deposited on the peripheral region in a small region, to spread around the peripheral region and so more of the channels are effective to channel liquid towards the outer side of the peripheral region.

An embodiment provides a substrate holder for use in a lithographic apparatus and configured to support a substrate, the substrate holder comprising:

a main body having a main body surface;

a plurality of burls projecting from the main body surface to support the substrate spaced apart from the main body surface; and a liquid control structure provided in a peripheral region of the main body surface and configured to hinder movement of liquid across the peripheral region toward the center of the main body surface, but not to hinder movement of gas across the peripheral region.

In an embodiment the liquid control structure comprises a plurality of first regions having a first contact angle to a liquid and a plurality of second regions having a second contact angle to the liquid that is different from the first contact angle, the first and second regions extending parallel to the periphery of the substrate holder and alternating in the radial direction. Alternating regions of different contract angles function to slow or stop flow of liquid inwardly of the substrate holder.

In an embodiment the liquid control structure comprises a plurality of grooves extending parallel to the periphery of the substrate holder.

In an embodiment the liquid control structure is provided on a liquid control member adhered to the main body surface. In this way, the liquid control structure can easily be made on a separate member which is then attached to the main body surface.

In an embodiment the liquid control structure extends around substantially the entire periphery of the main body surface. By providing the liquid control structure extending around substantially the entire periphery of the main body surface, it is possible to ensure that liquid is dealt with wherever on the periphery of the substrate holder it might get to. Alternatively, if it is known that in use of the apparatus liquid will only get under the substrate in limited regions of the periphery then it is possible to provide the liquid control structure at only those positions.

In an embodiment the inner side of the liquid control structure is located within an area of the main body surface covered by a substrate when supported by the substrate holder. If the liquid control structure extends under the substrate when supported by the substrate holder it is possible to ensure that liquid that goes under the substrate is removed. However, it is desirable to minimize the amount of the liquid control structure that is underneath the substrate to minimize the area of the substrate that is unsupported.

In an embodiment the liquid control structure is formed of a different material from the main body, for example, the liquid control structure is formed of titanium and the main body is formed of SiSiC. If the liquid control structure is formed of a different material from the main body, it is possible to select a material for the liquid control structure in which it is easy to form structures of the necessary scale whilst avoid compromising the material requirements for the main body of the substrate holder. In particular, the desired structures can easily be formed in titanium by a variety of techniques including machining, molding or additive manufacturing.

Figure 5:
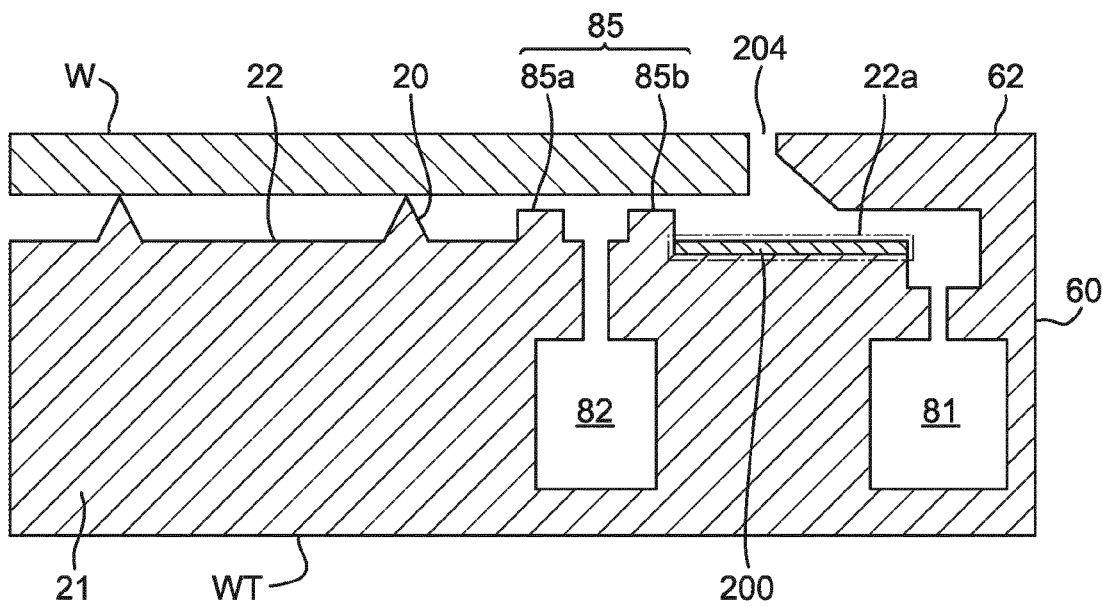
FIG. 5 depicts in cross-section a part of a substrate holder according to an embodiment.

FIG. 5 depicts a substrate holder WT forming part of substrate support apparatus 60 according to an embodiment. Substrate holder WT has the same shape in plan as a substrate, e.g. circular, and is substantially the same size as a substrate, e.g. 300 mm or 450 mm in diameter. Substrate holder WT comprises a main body 21 having a main body upper surface 22 and a plurality of burls 20 projecting from the main body upper surface 22. In an embodiment, burls 20 have a height hi in the range of from 100 μm to 500 μm, e.g. about 150 μm. A substrate W can be supported by the distal end surfaces of burls 20, which conform to a substantially flat support plane to support the substrate W in a flat state. Main body 21 and burls 20 may be formed of SiSiC, a ceramic material having silicon carbide (SiC) grains in a silicon matrix.

A plurality of through-holes (not shown in FIG. 5) are formed in the main body 21. Through-holes 89 allow the e-pins to project through the substrate holder WT to receive the substrate W and allow the space between the substrate W and the substrate holder WT to be evacuated by connection to a clamp under pressure. Other structures, e.g. to control gas flow and/or thermal conductivity between the substrate holder WT and the substrate W, can be provided. An edge seal 85 is provided near the periphery of substrate holder WT. Edge seal 85 is a pair of projecting edge seal ridges 85a, 85b around the outside of substrate holder WT. Edge seal ridges 85a, 85b have a height slightly shorter, e.g. by about 10 μm, than that of the burls 20 so that they do not contact the substrate W but reduce the gas flow into the space 201 between the substrate W and substrate holder WT so as to improve vacuum clamping. Burls 20 can be provided in the region between edge seal ridges 85a, 85b; in FIG. 5 none are shown but it is possible to have one or more rows of burls in this region. The substrate holder WT can also be provided with electronic components, e.g. heaters and sensors, to control the temperature of the substrate holder WT and substrate W.

A peripheral region 22a of the main body upper surface 22 of substrate holder WT extends outwardly from edge seal ridge 85b beyond the circumference of substrate W and reaching close to first extraction opening 81. In an embodiment, the peripheral region 22a is an annular region having an inner diameter slightly less than the diameter of the substrate W and an outer diameter slightly greater than that of the substrate W. In an embodiment, the radial width of peripheral region 22a is a few mm, e.g. less than 10 mm. Peripheral region 22a is provided with a liquid control structure 200 that promotes liquid flow outwardly, i.e. towards first extraction opening 81. Liquid control structure 200 is arranged so that liquid thereon flows outward preferentially, i.e. it is easier for liquid to flow outward than to flow inward.

Figure 6:
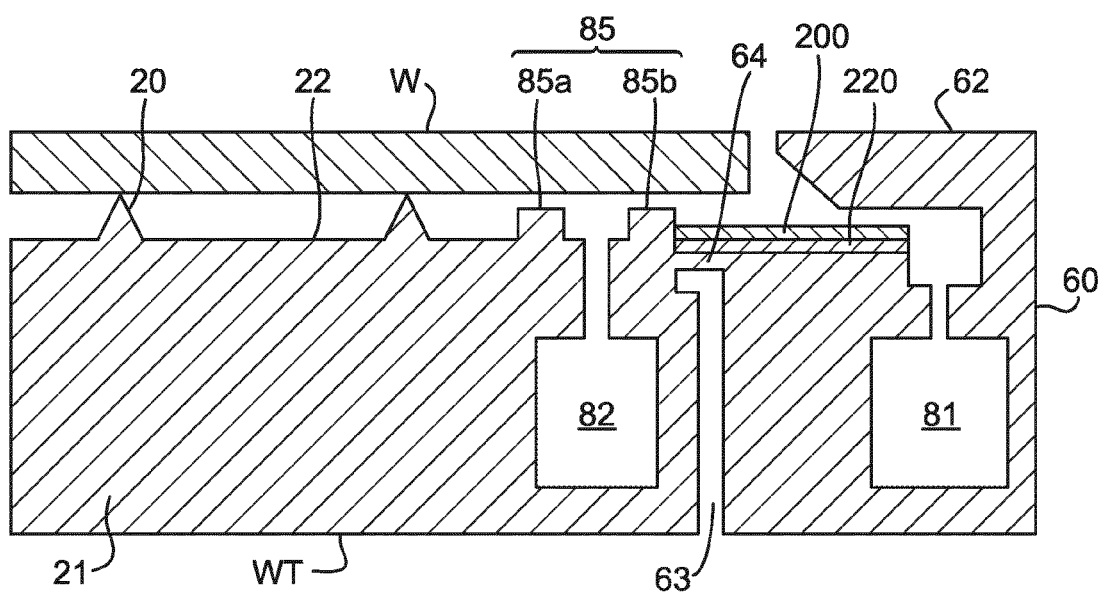
FIG. 6 depicts in cross-section a part of another substrate holder according to an embodiment.

FIG. 6 depicts an alternative arrangement of substrate support apparatus 60 in which substrate holder WT is separated from the outer part of substrate support apparatus 60, including first extraction channel 81 by a thermal gap 63. A small bridge 64 connects the substrate holder WT to the outer part of substrate support apparatus 60. A liquid control member 220 is provided on top of the outer part of substrate support apparatus 60 and extending across the bridge 64 to form the peripheral part of main body surface 22. Liquid control structure 200 is provided on liquid control member 220. Bridge 64 may be omitted, so that the substrate holder WT is isolated from the outer part of substrate support apparatus 60. In that case, the liquid control member 220 spans the gap between the substrate holder WT and the outer part of substrate support apparatus 60 and desirably has low stiffness and low thermal conductivity.

Liquid control member 220 may be a flexible member, e.g. a sticker, which is adhered to the peripheral region 22a. Alternatively, liquid control member 220 may be a more rigid ring inset into substrate holder WT.

Figure 7:
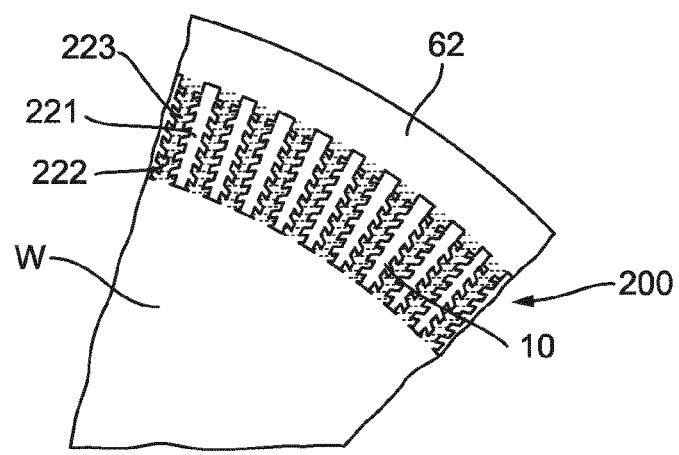
FIG. 7 is a plan view of a part of a substrate holder according to an embodiment in situ.

FIG. 7 depicts schematically a form of liquid control structure 200 usable in an embodiment. Liquid control structure 200 comprises a plurality of radial walls 221 provided with fins 222 and defining between them a plurality of channels 223. Fins 222 are angled so as to point radially inwardly of the substrate holder WT. In FIG. 7 liquid control structure 200 is shown visible in the gap 204 between the substrate W and cover ring 62. Cover ring 62 is part of substrate support apparatus 60 and covers first extraction opening 81 so as to provide an upper surface coplanar with the upper surface of the substrate W.

Figure 8:
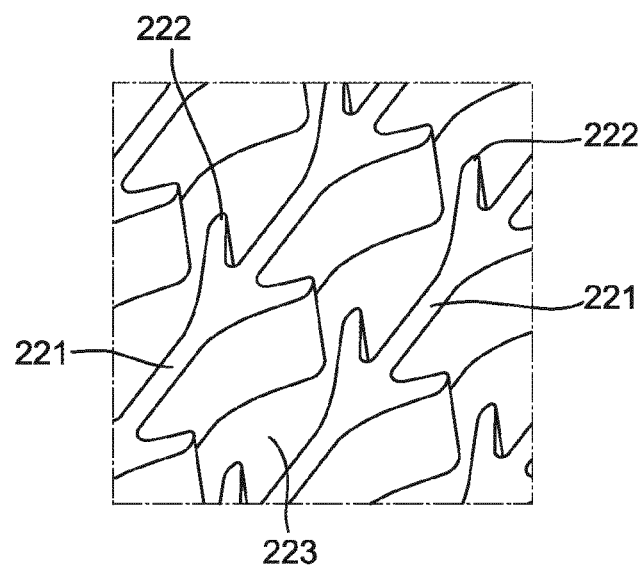
FIG. 8 is an enlarged perspective view of parts of channels in an embodiment.

FIG. 8 is an enlarged view of a part of liquid control structure 200 comprising radial walls 221 and fins 222. It can be seen that fins 222 are arranged in pairs extending inwardly from opposite sidewalls of each channel 223. For ease of manufacture, the fins 222 in all of the channels 223 are aligned but that is not necessary.

Figure 9A:
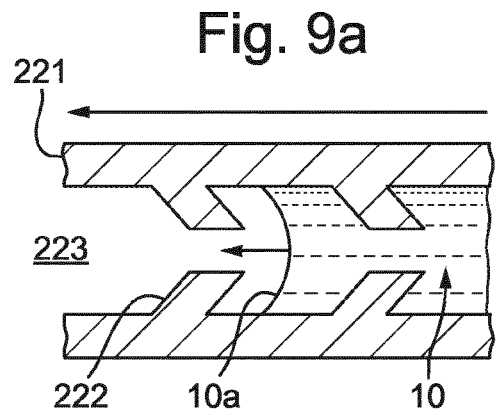
FIGS. 9*a*-9*f* are diagrams explaining preferential flow in channels of an embodiment.
Figure 9D:
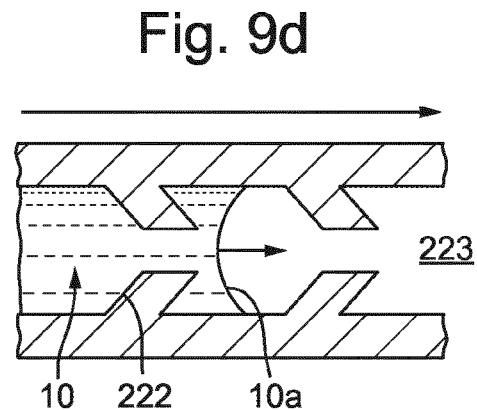
Figure 9B:
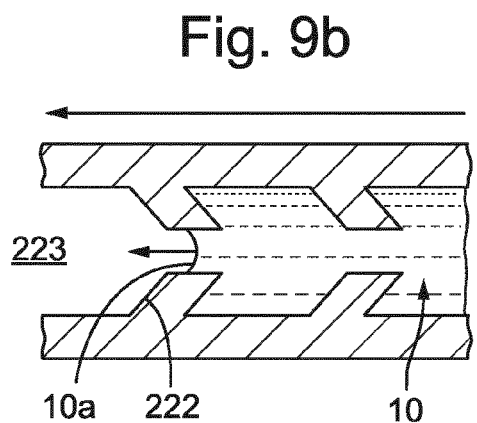
Figure 9E:
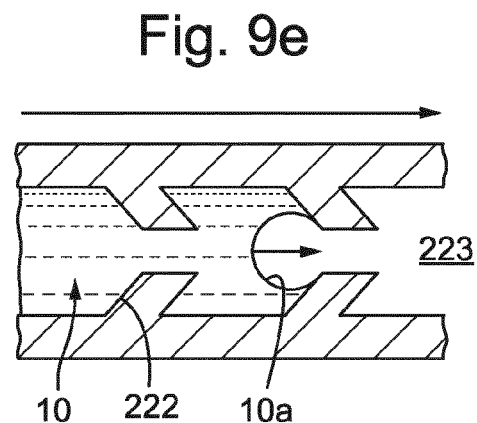
Figure 9C:
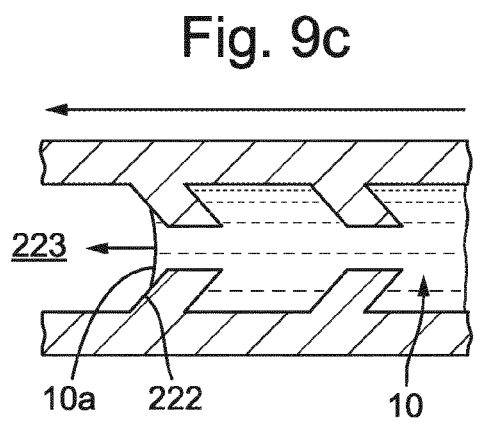

FIGS. 9a to 9f illustrate the effect of the fins 222 on liquid seeking to flow through a channel 223. In FIGS. 9a to 9c, liquid is shown flowing in the easy wicking direction. It can be seen that the meniscus 10a of the immersion liquid 10 is always concave so that surface tension in the meniscus 10a generates a force that pulls immersion liquid 10 in the easy wicking direction, as indicated by the arrow. In FIG. 9a the meniscus 10a is in the wide part of the channel 223. In FIG. 9b the meniscus 10a is in the narrowest part of the channel 223 between opposing ends of two fins 102 and in FIG. 9c the meniscus 10a is between two rear surfaces of the fins 222. In each case the meniscus 10a is allowed to be concave.

Figure 9F:
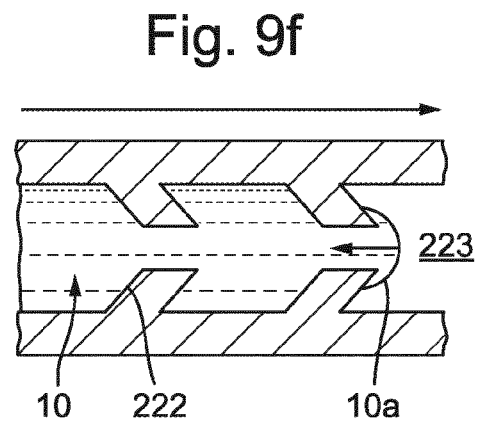

FIGS. 9d to 9f show the stages of liquid flow in the hard wicking direction. In FIG. 9d, the meniscus 10a is in the wide part of the channel 223 and is concave so that forces generated by surface tension in the meniscus 10a advance the liquid flow. The same applies in the situation shown in FIG. 9e where the meniscus 10a is on the rear surfaces of the fins 222. However, in the situation shown in FIG. 9f, as immersion liquid 10 begins to exit the gap between the ends of two fins 222 at the leading side, the meniscus 10a is forced to adopt a convex configuration. In the convex configuration, the forces generated by surface tension in the meniscus 10a tend to impede further advance of the immersion liquid 10. Therefore, liquid flow in the hard wicking direction tends to be pinned at a set of fins 222. Therefore, the structure depicted in FIGS. 7 and 8 can be referred to as a microfluidic diode in that it readily allows flow in one direction but resists flow in the opposite direction.

Figure 10:
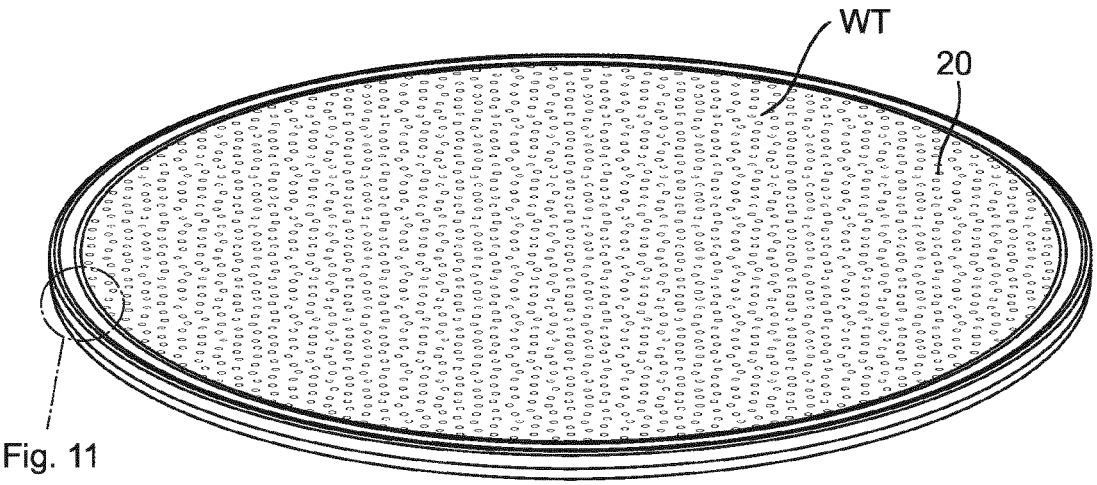
FIG. 10 depicts a substrate holder according to another embodiment.
Figure 11:
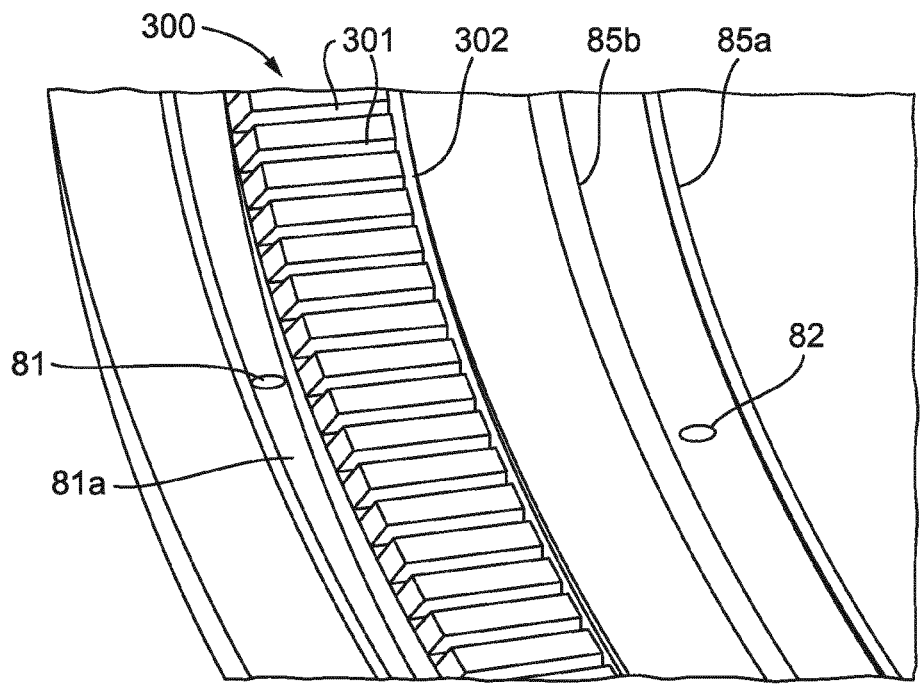
FIG. 11 is an enlarged view of part of the substrate holder of FIG. 10.

FIGS. 10 and 11 depict a substrate holder WT according to another embodiment. For simplicity some details, such as clamp openings 89, are omitted from FIG. 10. FIG. 11 is an enlarged view of a part of FIG. 10. As shown in FIG. 11, liquid control structure 300 comprises a plurality of radial channels 301 provided in the peripheral region of substrate holder WT. Radial channels 301 may have a width in the circumferential direction in the range of from 50 µm to 100 µm, e.g. in the range of from 60 µm to 80 µm. The length of the radial channels 301 in the radial direction is a few mm, e.g. less than 10 mm. The depth of the radial channels 301 in a direction perpendicular to the plane of the upper surface of substrate holder WT may be in the range of from 50 µm to 100 µm, e.g. about 80 µm. In an embodiment, radial channels 301 taper (i.e. reduce in width) outwardly, i.e. away from the center of substrate holder WT. In an embodiment, radial channels 301 increase in depth towards the outside of substrate holder WT. The taper in width and increase in depth individually and in combination promote flow of liquid outwardly, away from the center of substrate holder WT. Radial channels 301 are desirably open at their outer ends and may end at the very edge of the substrate holder WT or at a step in the substrate holder WT. In an embodiment, radial channels 301 end at a gutter 81a which leads immersion liquid to first extraction opening 81. The outer ends of radial channels 301 may be under the cover ring 62 such as depicted in FIG. 6, when the substrate holder WT is installed in the substrate support apparatus 60.

At the inner ends of radial channels 301, a circumferential groove 302 is provided. In an embodiment circumferential groove 302 extends in a complete loop all the way around the inner ends of radial channels 301. Circumferential groove 302 is in fluid communication with the inner ends of radial channels 301. Circumferential groove 302 may have a width in the radial direction of between 100 µm and 500 µm. Circumferential groove 302 may have a depth approximately equal to the depth of channels 301. Circumferential groove 302 functions to distribute liquid that may enter under substrate W around the circumference of substrate holder WT. Since the source of liquid getting under substrate W is localized and intermittent, circumferential groove 302 assists in distributing the liquid around the peripheral region of the substrate holder WT so that a larger number of radial channels 301 can direct the liquid outwardly.

Figure 12:
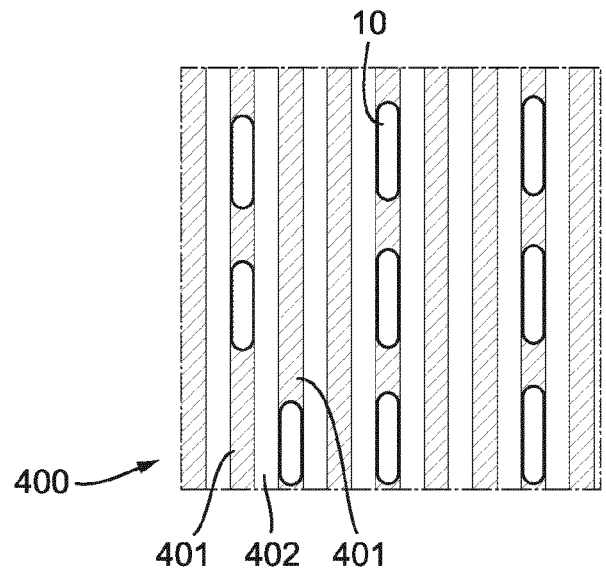
FIGS. 12 and 13 depict behavior of droplets of liquid on a surface having regions of different contact angle.
Figure 13:
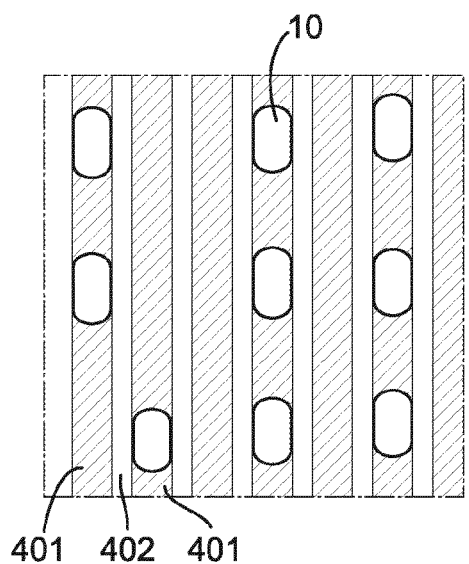

FIGS. 12 and 13 depict a further liquid control structure 400 according to an embodiment. Liquid control structure 400 comprises a series of alternating liquid control regions 401, 402. Liquid control regions 401, 402 are of two types: first liquid control regions 401 have relatively low contact angle (high surface energy) to the immersion liquid 10, whilst second liquid control regions 402 have relatively high contact angle (low surface energy) to the immersion liquid 10. Liquid control structure 400 therefore has alternate stripes of high contact angle and low contact angle.

Figure 14:
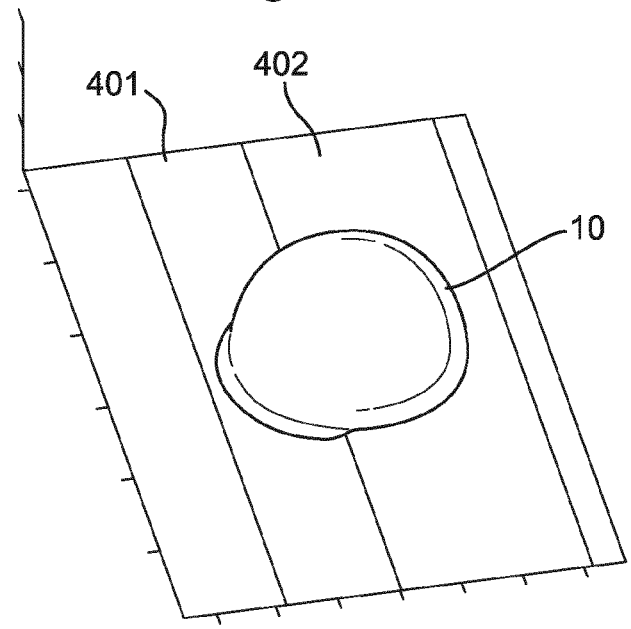
FIGS. 14 and 15 depict behavior of a droplet on a surface having regions of different contact angle.
Figure 15:
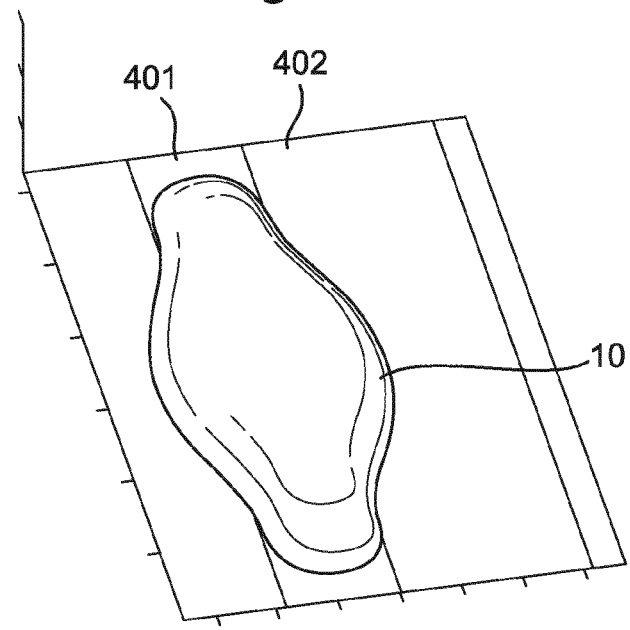

As depicted in FIGS. 12 and 13, liquid droplets landing on liquid control structure 400 arrange themselves in droplets confined to the first liquid control regions 401 (low contact angle). This is shown dynamically in FIGS. 14 and 15. FIG. 14 shows a droplet of immersion liquid 10 as it initially falls onto the surface in contact with first liquid control region 401 and FIG. 15 shows how the droplet of immersion liquid 10 spreads onto and along first liquid control region 401 of low contact angle. If the amount of liquid flowing onto liquid control structure 400 is larger, the droplets may coalesce into continuous elongate regions but the liquid will prefer to flow along the first liquid control regions 401 rather than spreading across the liquid control structure 400. Therefore, the liquid control structure 400 operates to hinder the flow of liquid across it. If volumes of liquid are even higher, the first liquid control regions 401 may act to pin an advancing meniscus and thereby hinder flow of liquid across liquid control structure 400.

Figure 16:
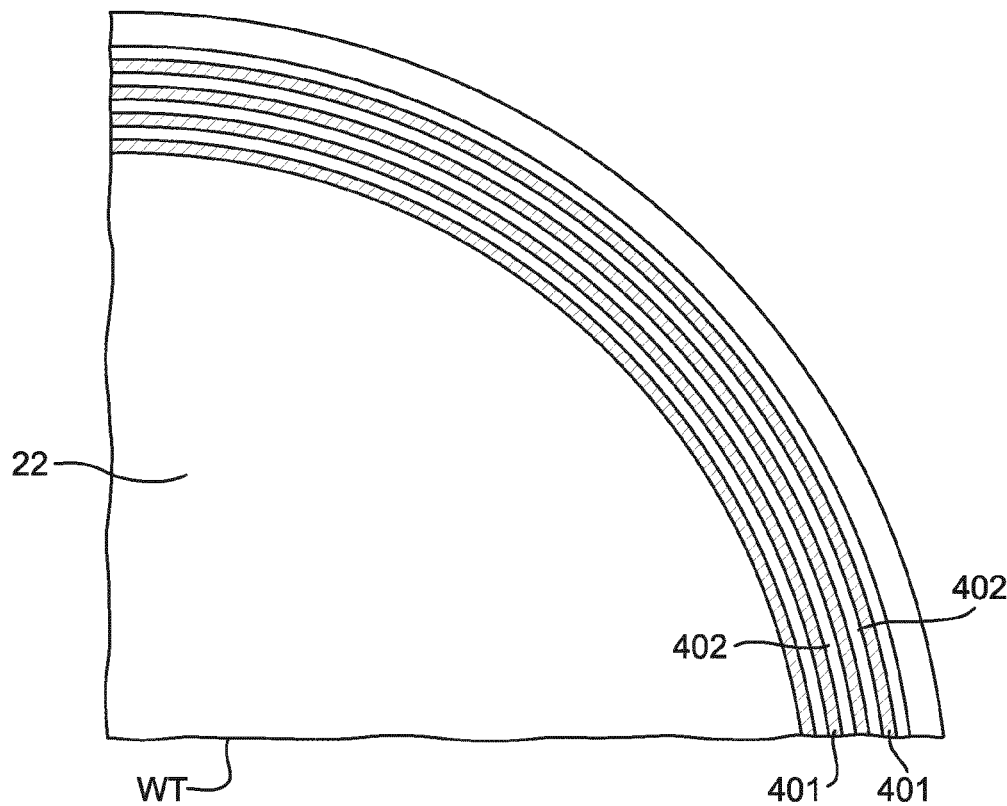
FIG. 16 depicts in plan a part of a substrate holder according to an embodiment.

FIG. 16 depicts liquid control structure 400 on part of a substrate holder WT. The alternating stripes of low contact angle and high contact angle are arranged as concentric rings in a peripheral region of main body upper surface 22 of substrate holder WT. In this configuration, liquid control structure 400 inhibits flow of liquid toward the center of substrate holder WT. Liquid control structure 400 however does not hinder the flow of gas across the peripheral region and therefore does not delay the release of the underpressure in the central regional where the substrate W is to be unloaded.

The first and second liquid control regions 401, 402 of relatively low and relatively high contact angle can be formed by various means, including chemical or mechanical treatment of an existing surface, or by deposition of different additional materials. The regions of low contact angle (high surface energy) may have a width in the radial direction in the range of from 50 µm to 1 mm. The regions of high contact angle (low surface energy) may have a width in the radial direction in the range of from 50 µm to 1 mm.

Figure 17:
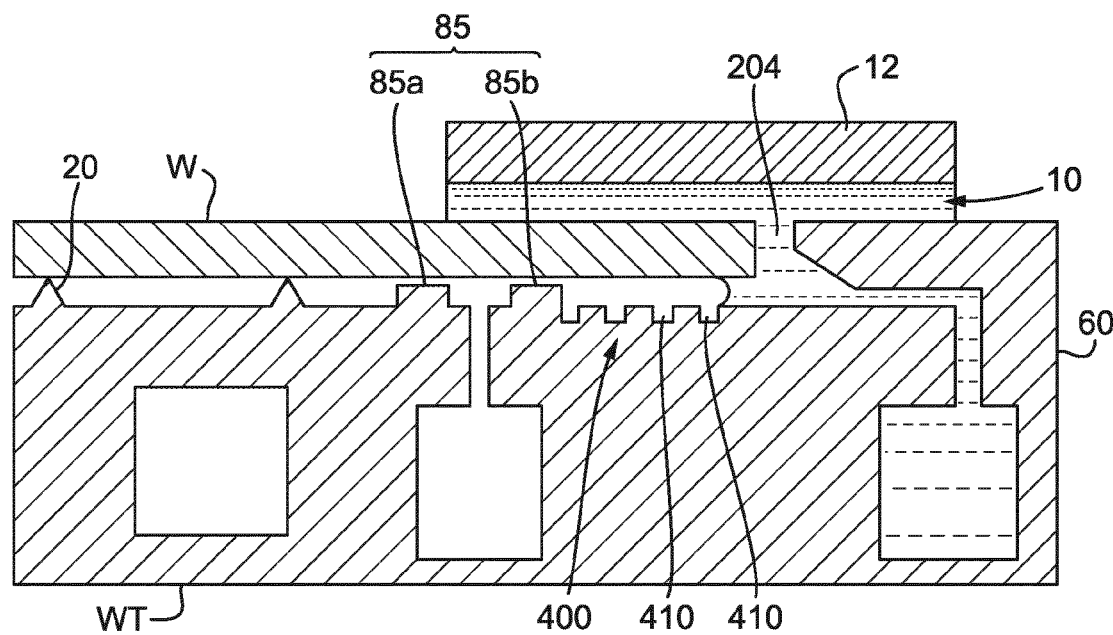
FIG. 17 depicts in cross-section a part of a substrate holder according to an embodiment.

FIG. 17 depicts in cross-section a part of a substrate holder WT according to another embodiment. The substrate holder WT of FIG. 17 has a liquid control structure 400 comprising a plurality of circumferential grooves 410 provided in the peripheral region outside of edge seal ridge 85b. The circumferential grooves 410 are concentric. Circumferential grooves 410 function similarly to the first liquid control regions 401 of relatively low contact angle in promoting flow of liquid in the circumferential direction but hampering flow of liquid radially inward of substrate holder WT. Circumferential grooves 410 may function as meniscus pinning features It will be appreciated that the different liquid control structures described above can be used in combination with synergistic effect. In particular, use of a liquid control structure such as that described with reference to FIG. 16 or 17 together with a liquid control structure such as described with reference to FIG. 7 to 9 or 11 located radially outward has particular advantage. The inner liquid control structure hinders flow of liquid toward the interior of substrate holder WT whilst the outer liquid control structure encourages flow of liquid toward the outside of substrate holder WT.

In an embodiment, there is provided a substrate holder for use in a lithographic apparatus and configured to support a substrate, the substrate holder comprising: a main body having a main body surface; a plurality of burls projecting from the main body surface to support the substrate spaced apart from the main body surface; and a liquid control structure provided in a peripheral region of the main body surface and configured to cause liquid to preferentially flow toward the periphery of the main body surface.

In an embodiment, the liquid control structure comprises a plurality of channels extending from an inner side of the peripheral region to an outer side of the peripheral region. In an embodiment, the liquid control structure further comprises a plurality of fins projecting from side walls of the channels and angled towards the inner side of the peripheral region. In an embodiment, the plurality of channels reduce in width towards the outer side of the peripheral region. In an embodiment, the plurality of channels increase in depth towards the outer side of the peripheral region. In an embodiment, the liquid control structure creates capillary forces to cause liquid to preferentially flow toward the periphery of the main body surface. In an embodiment, the liquid control structure further comprises a groove extending along the inner side of the peripheral region.

In an embodiment, there is provided a substrate holder for use in a lithographic apparatus and configured to support a substrate, the substrate holder comprising: a main body having a main body surface; a plurality of burls projecting from the main body surface to support the substrate spaced apart from the main body surface; and a liquid control structure provided in a peripheral region of the main body surface and configured to hinder movement of liquid across the peripheral region toward the center of the main body surface, but not to hinder movement of gas across the peripheral region.

In an embodiment, the liquid control structure comprises a plurality of first regions having a first contact angle to a liquid and a plurality of second regions having a second contact angle to the liquid that is different from the first contact angle, the first and second regions extending parallel to the periphery of the substrate holder and alternating in the radial direction. In an embodiment, the liquid control structure comprises a plurality of grooves extending parallel to the periphery of the substrate holder. In an embodiment, the liquid control structure is provided on a liquid control member adhered to the main body surface. In an embodiment, the liquid control structure extends around substantially the entire periphery of the main body surface. In an embodiment, the inner side of the liquid control structure is located within an area of the main body surface covered by the substrate when supported by the substrate holder.

In an embodiment, there is provided a lithographic apparatus for projecting an image onto a substrate, the lithographic apparatus comprising: a substrate holder as described herein; and a clamp system for clamping a substrate to the substrate holder.

In an embodiment, there is provided a method of manufacturing devices using a lithographic apparatus having a substrate holder as described herein, and a clamp system for clamping a substrate to the substrate holder, the method comprising: loading the substrate onto the substrate holder; engaging the clamp system; exposing a pattern onto the substrate; releasing the clamp system; and lifting the substrate off the substrate holder.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according to the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
   a main body having a main body surface;
   a plurality of burls projecting from the main body surface to support the substrate spaced apart from the main body surface; and
   a passive liquid control structure provided in a peripheral region of the main body surface, the passive liquid control structure itself configured to allow liquid to flow more easily in one direction across the main body surface than in an opposite direction across the main body surface.

2. The substrate holder according to claim 1, wherein the liquid control structure comprises a channel extending from an inner side of the peripheral region to an outer side of the peripheral region.

3. The substrate holder according to claim 2, wherein the liquid control structure further comprises a plurality of fins projecting from side walls of the channel.

4. The substrate holder according to claim 3, wherein the fins are angled towards the inner side of the peripheral region.

5. The substrate holder according to claim 2, wherein the channel reduces in width towards the outer side of the peripheral region.

6. The substrate holder according to claim 2, wherein the channel increases in depth towards the outer side of the peripheral region.

7. The substrate holder according to claim 1, further comprising a groove at the liquid control structure, the groove extending essentially parallel to a periphery of the substrate holder.

8. A substrate holder for use in a lithographic apparatus and configured to support a substrate, the substrate holder comprising:
   a main body having a main body surface;
   a plurality of burls projecting from the main body surface to support the substrate spaced apart from the main body surface; and
   a channel configured to, by liquid-philic or -phobic force caused by a chemical or mechanical characteristic of the channel and/or by mechanical force, preferentially allow liquid flow therein in one direction across the main body surface relative to an opposite direction therein across the main body surface.

9. The substrate holder according to claim 8, wherein the channel comprising a plurality of protrusions therein.

10. The substrate holder according to claim 9, wherein the protrusions comprises a plurality of fins projecting from side walls of the channel and angled towards the inner side of a peripheral region of the main body surface.

11. The substrate holder according to claim 8, wherein the channel reduces in width towards the outer side of a peripheral region of the main body surface.

12. The substrate holder according to claim 8, wherein the channel increases in depth towards the outer side of a peripheral region of the main body surface.

13. The substrate holder according to claim 8, further comprising a groove at the channel, the groove extending essentially parallel to a periphery of the substrate holder.

14. A substrate holder for use in a lithographic apparatus and configured to support a substrate, the substrate holder comprising:
   a main body having a main body surface;
   a plurality of burls projecting from the main body surface to support the substrate spaced apart from the main body surface; and
   a plurality of protrusions, the protrusions configured to preferentially allow liquid flow in one direction across the main body surface relative to an opposite direction across the main body surface.

15. The substrate holder according to claim 14, wherein the protrusions comprise a plurality of fins projecting from walls.

16. The substrate holder according to claim 15, wherein the fins are angled towards the inner side of a peripheral region of the main body surface.

17. The substrate holder according to claim 15, further comprising a plurality of channels at a peripheral region of the main body surface, wherein the channels reduce in width towards the outer side of the peripheral region.

18. The substrate holder according to claim 15, further comprising a plurality of channels at a peripheral region of the main body surface, wherein the channels increase in depth towards the outer side of the peripheral region.

19. The substrate holder according to claim 14, further comprising a groove adjacent the protrusions, the groove extending essentially parallel to a periphery of the substrate holder.

20. The substrate holder according to claim 14, wherein the protrusions are located around substantially an entire periphery of the main body surface.

* * * * *